US007037795B1

(12) United States Patent
Barr et al.

(10) Patent No.: US 7,037,795 B1
(45) Date of Patent: May 2, 2006

(54) LOW RC PRODUCT TRANSISTORS IN SOI SEMICONDUCTOR PROCESS

(75) Inventors: Alexander L. Barr, Crolles (FR); Olubunmi O. Adetutu, Austin, TX (US); Bich-Yen Nguyen, Austin, TX (US); Marius K. Orlowski, Austin, TX (US); Mariam G. Sadaka, Austin, TX (US); Voon-Yew Thean, Austin, TX (US); Ted R. White, Crolles (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/965,964

(22) Filed: Oct. 15, 2004

(51) Int. Cl.
*H01L 21/336* (2006.01)

(52) U.S. Cl. ...................................................... 438/300

(58) Field of Classification Search ................ 438/142, 438/149, 197, 222, 226, 230, 233, 256, 299, 438/300, 301, 303, 311, 400, 403, 429, 430; 257/E21.619, E21.634
See application file for complete search history.

(56) References Cited

U.S. PATENT DOCUMENTS 6,335,214 B1 * 1/2002 Fung ........................... 438/30
6,369,438 B1 4/2002 Sugiyama et al.
6,380,088 B1 4/2002 Chan et al.
6,420,218 B1 7/2002 Yu
6,437,404 B1 8/2002 Xiang et al.
6,472,258 B1 10/2002 Adkisson et al.
6,531,347 B1 3/2003 Huster et al.
6,656,782 B1 12/2003 Skotnicki et al.
2002/0034841 A1 * 3/2002 Lee ............................ 438/149

* cited by examiner

*Primary Examiner*—Brook Kebede
(74) *Attorney, Agent, or Firm*—Joseph P. Lally

(57) ABSTRACT

A semiconductor fabrication process includes forming a transistor gate overlying an SOI wafer having a semiconductor top layer over a buried oxide layer (BOX) over a semiconductor substrate. Source/drain trenches, disposed on either side of the gate, are etched into the BOX layer. Source/drain structures are formed within the trenches. A depth of the source/drain structures is greater than the thickness of the top silicon layer and an upper surface of the source/drain structures coincides approximately with the transistor channel whereby vertical overlap between the source/drain structures and the gate is negligible. The trenches preferably extend through the BOX layer to expose a portion of the silicon substrate. The source/drain structures are preferably formed epitaxially and possibly in two stages including an oxygen rich stage and an oxygen free stage. A thermally anneal between the two epitaxial stages will form an isolation dielectric between the source/drain structure and the substrate.

17 Claims, 4 Drawing Sheets

100 110 130 116 112 114 117 116 130 101 134 134 104 107 104 132 136 132 136 102

101 130 116 112 114 117 116 130 134 134 104 127 127 107 127 127 104 132 136 132 136 102

LOW RC PRODUCT TRANSISTORS IN SOI SEMICONDUCTOR PROCESS

FIELD OF THE INVENTION

The present invention is in the field of semiconductor fabrication processes and more particularly semiconductor fabrication processes employing silicon-on-insulator (SOI) technology.

RELATED ART

Historically, transistors in conventional CMOS semiconductor fabrication processes were fabricated as "bulk" transistors, meaning that the source/drain regions and the active channel region were formed in an upper portion of the semiconductor bulk substrate. Bulk transistors suffer from large junction capacitance, which slows devices. SOI technology was developed, at least in part, to address this problem. In an SOI process, the starting material includes a thin semiconductor top layer overlying a buried dielectric layer, sometimes referred to herein as a buried oxide (BOX) layer overlying a semiconductor substrate or bulk. The active devices such as transistors are formed in the thin top layer.

SOI processes improved the junction capacitance problem, but encountered other undesirable effects as the top layer becomes thinner. Specifically, conventional SOI transistors exhibited increased resistance, sometimes denoted as a transistor's external resistance ($R_{ext}$) due to very thin source/drain regions. Elevated source/drain regions were then proposed and developed to reduce $R_{ext}$, but the elevated source/drain structure introduced increased capacitive coupling between the source/drain regions and the transistor gate. It would be desirable to implement a SOI technology that includes transistors having low junction capacitance, low external resistance, and low capacitive coupling between source/drain and gate.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention is concerned with forming transistors in SOI wafer technologies in a manner that reduces junction capacitance and short channel effects while minimizing increases in external resistance and parasitic capacitive coupling. The invention includes the use of source/drain regions that are recessed within the BOX layer to minimize capacitance between source/drain and gate. These regions will be referred to as recessed source/drain regions for simplicity although they may include the extension regions as well. The recessed source/drain regions may include tapered sidewalls to reduce junction capacitance. The source/drain regions are formed epitaxially using the wafer substrate as the epitaxial seed or template. One sequence may include a two-stage or two-step epitaxial process in which an oxygen rich epitaxial layer is formed at the base of the recessed source/drain region (i.e., overlying the substrate) followed by the formation of a "normal" or substantially oxygen-free epitaxial layer. The oxygen in the oxygen rich epitaxial layer facilitates the formation of an oxide between the substrate and the recessed source/drain thereby isolating the source/drain from the substrate.

Figure 1:
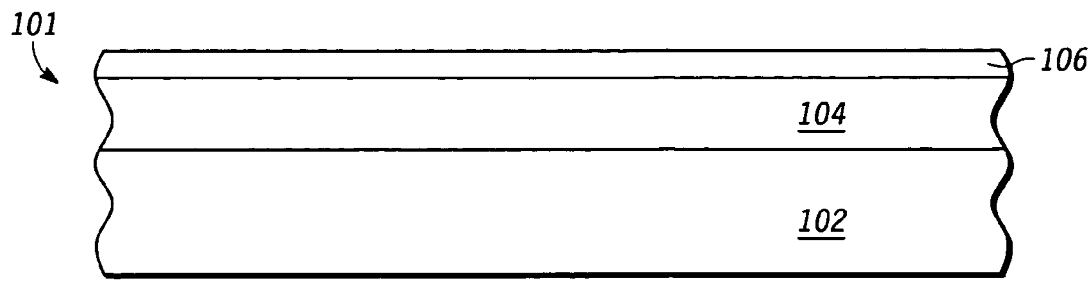
FIG. 1 is a partial cross sectional view of an SOI wafer.

Turning now to the drawings, FIGS. 1 through 9 illustrate selected stages in a first embodiment of a wafer processing sequence according to the present invention. In FIG. 1, a wafer 101 suitable for use with the present invention is depicted. As depicted in FIG. 1, wafer 101 is an SOI wafer having a semiconductor top layer or active layer 106 overlying a buried oxide (BOX) layer 104 overlying a semiconductor bulk or substrate 102. Active layer 106 and substrate 102 are likely to be single crystal silicon or silicon germanium while BOX layer 104 is likely to be a silicon oxide compound such as thermally formed silicon dioxide.

Figure 2:
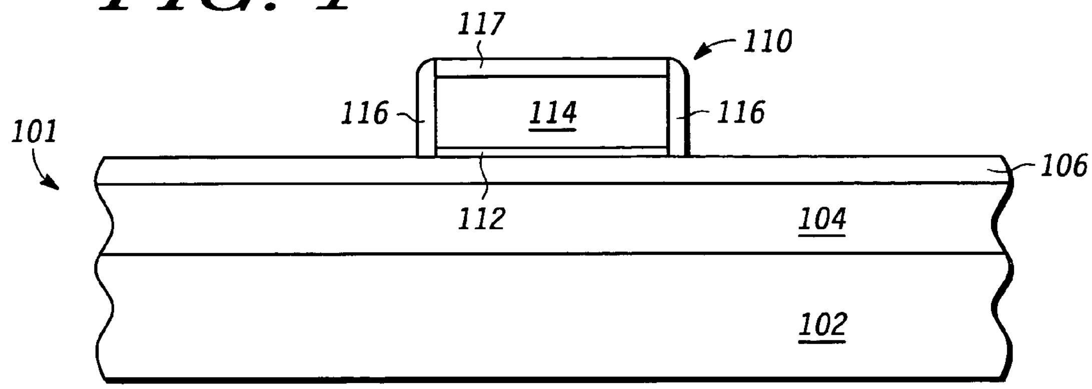
FIG. 2 illustrates subsequent processing of the wafer of FIG. 1 in which a transistor gate structure is formed overlying an active region of the wafer.

Turning now to FIG. 2, a transistor gate structure 110 has been formed overlying active layer 106 of wafer 101. In the depicted implementation, gate structure 110 includes a gate dielectric layer 112, a gate electrode 114, dielectric sidewalls 116, and a dielectric capping layer 117. Gate dielectric 112, in one embodiment, is a thermally formed silicon dioxide. In other embodiments, gate dielectric 112 is a high-K dielectric (a dielectric material having a dielectric constant in excess of approximately 4.0) most likely comprised of a metal-oxide compound such as $HfO2$. Gate electrode 114 is a conductive structure preferably comprised of doped polysilicon, a metal or metal alloy (e.g., TaSi, Ti, TiW, etc.), or a combination thereof. Dielectric spacers 116 and capping layer 117 are preferably comprised of silicon nitride or another dielectric that has good etch selectivity characteristics relative to silicon.

Figure 3:
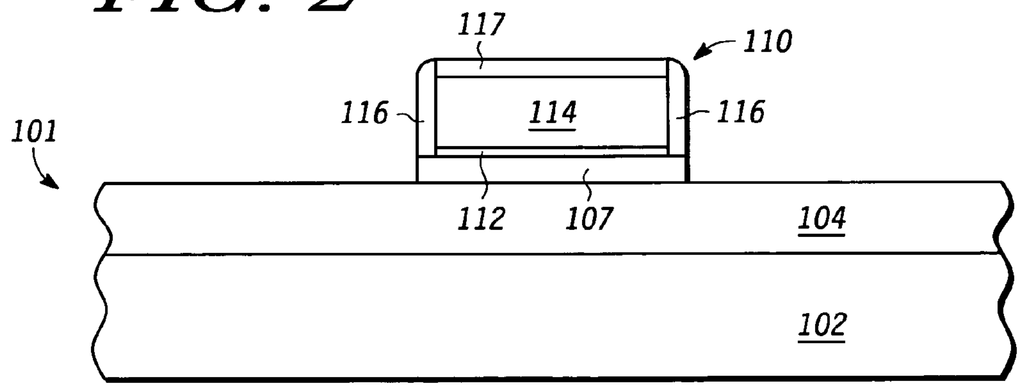
FIG. 3 illustrates processing subsequent to FIG. 2 in which portions of the wafer top layer are removed.

Referring now to FIG. 3, exposed portions of active layer 106 are removed (e.g., etched) thereby resulting in the formation of a transistor channel structure 107 (comprised of the portion of active layer 106 that is not removed). Beneficially, channel structure 107 formed in this manner is self-aligned to gate structure 110. The sidewalls 116 and capping layer 117 surrounding gate electrode 114 protect electrode 114 during the removal of active layer 106. The removal of the exposed portions of active layer 106 exposes the underlying portions of BOX layer 104. In an embodiment in which active layer 106 is epitaxial silicon (doped or undoped), the removal step may include a dry etch process using, for example, SF6 and Cl2 to achieve adequate selectively with respect to capping layer 117 as well as the underlying BOX layer 104. In one embodiment, the removal of exposed portions of active layer 106 is integrated into the gate etch step (i.e., the etch process that defines gate electrode 114). In this embodiment, the gate etch is maintained until the exposed portions of active layer 106 are removed thereby saving an etch step.

Figure 4:
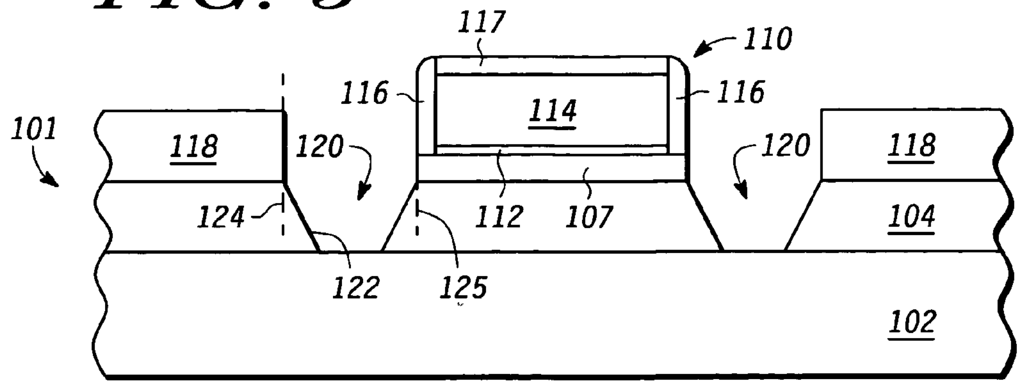
FIG. 4 illustrates processing subsequent to FIG. 3 in which source/drain trenches are formed in the buried oxide layer.

Referring now to FIG. 4, source/drain trenches 120 are formed in BOX layer 104. A patterned photoresist layer 118 is first formed overlying box layer 104 using conventional photolithography and photoresist techniques. In the depicted embodiment, patterned photoresist layer 118 defines a boundary or edge 124 of each source/drain trench 120 that is distal from channel structure 107 while a boundary or edge 125 of each trench 120 proximal to channel structure 107 is defined by and self-aligned to gate structure 110. Thus, source/drain trenches 120, like channel structure 107, are self-aligned to gate structure 110.

In one embodiment the trenches 120 are at a 90 degree angle with the respect to the substrate surface 102. In the embodiment depicted in FIG. 4, the etch of source/drain trenches 120 is controlled to produce sloped sidewalls 122. In this embodiment, sloped sidewalls 122 preferably exhibit an angle between 40 to 80 degrees an upper surface of substrate 102. When the source/drain structure that ultimately occupies source/drain trenches 120 conforms to sloped sidewalls 122, capacitive coupling to the underlying substrate is reduced due to the reduced area of the source/drain structure at the interface with substrate 102. Moreover, the sloped sidewall 122 beneficially produces reduces source to drain coupling.

Figure 5:
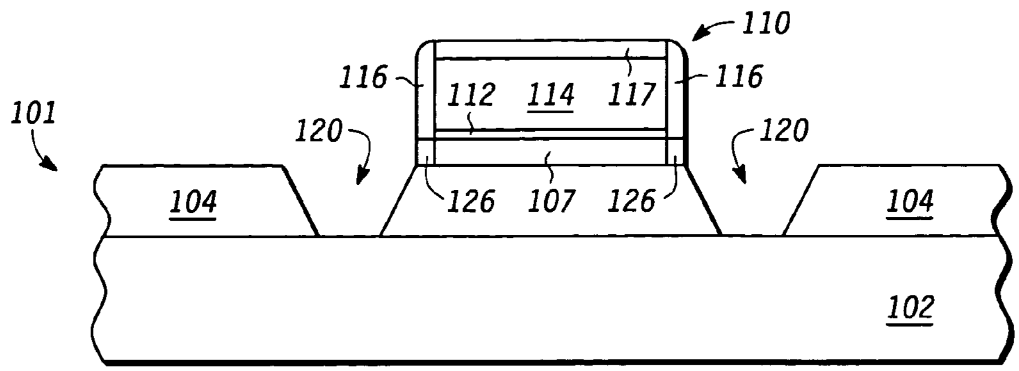
FIG. 5 illustrates processing subsequent to FIG. 4 in which exposed portions of the transistor channel are insulated.

Referring now to FIG. 5, following formation of the source/drain trenches 120, an oxide forming process is performed to isolate the channel region 107 from a subsequent epitaxial process. In one embodiment, the isolation of channel structure 107 is achieved by performing a thermal oxidation or reoxidation step to produce protective oxide structures 126 at the exposed edges of channel structure 107. The reoxidation step is preferably followed by a short plasma etch to remove oxide formed on the upper surface of the exposed portions of substrate 102 during the reoxidation thereby exposing the upper surface of substrate 102.

Figure 6:
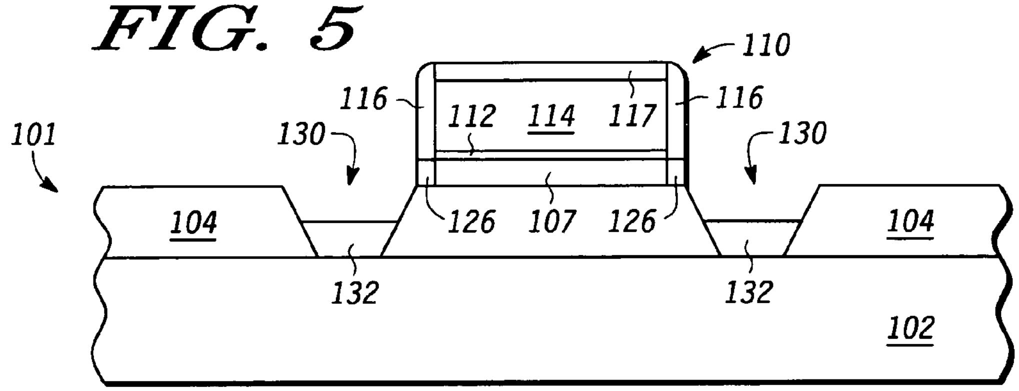
FIG. 6 illustrates processing subsequent to FIG. 5 in which a first epitaxial growth is performed to grow an epitaxial structure in the source/drain trenches.

Referring now to FIG. 6, the process of constructing recessed source/drain structures 130 is initiated. Using the exposed portions of substrate 102 as a seed, an epitaxial growth or deposition process is performed to grow or deposit a first epitaxial layer 132. First epitaxial layer 132 is preferably doped or undoped silicon or silicon germanium.

In the depicted embodiment, first epitaxial layer 132 only partially fills the source/drain trench 120 and thereby leaves room within source/drain 120 for formation of a second epitaxial layer. The formation of distinct first and second epitaxial layers in this embodiment, beneficially facilitates a process sequence in which first epitaxial layer 132 is electrically isolated from substrate 102 following the first epitaxial process. More specifically, one implementation of the invention includes depositing or growing first epitaxial layer 132 as an oxygen rich epitaxial layer (e.g., an epitaxial layer having an oxygen content not in excess of approximately 5%).

Figure 7:
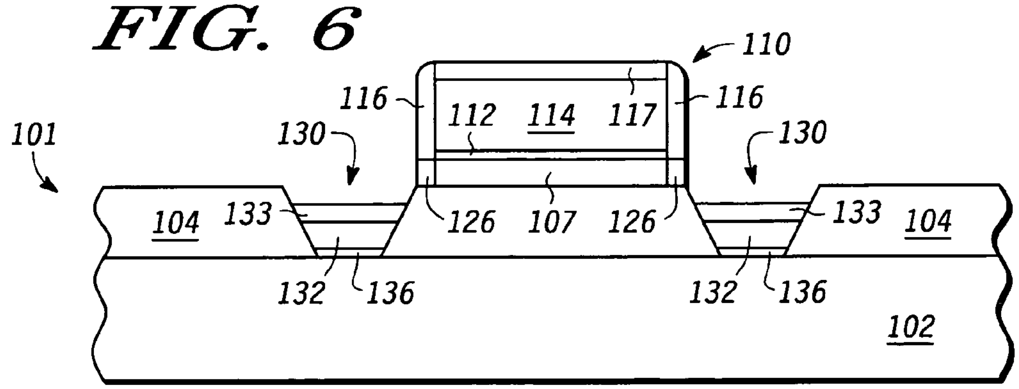
FIG. 7 illustrates processing subsequent to FIG. 6 in which an anneal is performed to isolate the first epitaxial structure from the wafer substrate.

Referring to FIG. 7, wafer 101 is annealed in an oxygen bearing ambient. The anneal of an oxygen rich first epitaxial layers causes the formation of an oxide layer 136 between epitaxial layer 132 and substrate 102 and a dielectric layer 133 overlying epitaxial layer 132. The presence of oxide layer 136 between epitaxial layer 132 and substrate 102 provides excellent electrical isolation between the two and further reduces the junction capacitance by increasing the effective distance between epitaxial layer 132 and substrate 102.

Figure 8:
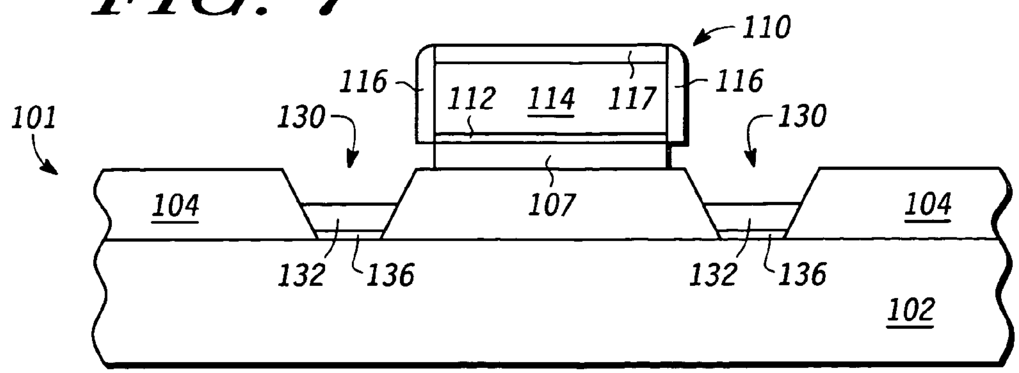
FIG. 8 illustrates processing subsequent to FIG. 7 in which oxide is removed to expose the first epitaxial structure and the active channel region.

Referring now to FIG. 8, an oxide removal process such as an HF dip is performed to remove the oxide layer 133 overlying epitaxial layer 132 and to remove protective oxide structures 126 thereby exposing the exterior edges of channel region 107. The oxide removal process is preferably a relatively short process, being just sufficient to remove oxide layer 133 and protective oxide structures 126, to minimize the amount of BOX layer 104 removed. In addition, the strip process is preferably selective to sidewall spacers 116 to protect the integrity of gate dielectric 112. In the preferred implementation, sidewalls spacers 116 are thicker than protective oxide structures 126 thereby ensuring protection against unintended etching of gate dielectric 112.

Figure 9:
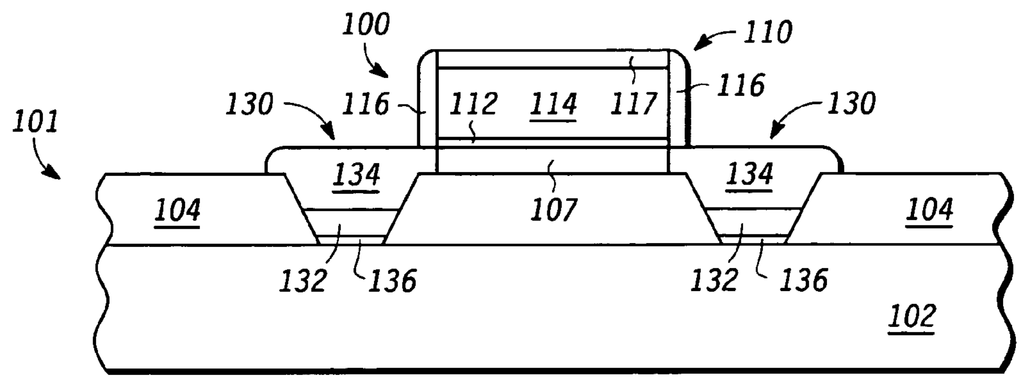
FIG. 9 illustrates processing subsequent to FIG. 8 in which a second epitaxial process is performed to form the transistor source/drain regions.

Referring now to FIG. 9, formation of recessed source/drain structures 130 is completed by forming a second epitaxial layer 134 overlying first epitaxial layer 132. Recessed source/drain structures 130 are so named because one may think of these regions as comprised of conventional elevated source/drain structures that are then "recessed" into the BOX layer 104. As such, recessed source/drain structures 130 exhibit the electrical resistivity characteristics of conventional elevated source/drain structures without exhibiting the parasitic capacitance characteristic of elevated source/drain transistors. Because the upper surface of recessed source/drain structures 130 is approximately coincident or planar with the upper surface of channel region 107, overlap and the resulting capacitive coupling between source/drains structures 130 and gate electrode 114 is beneficially minimized. In an embodiment where first epitaxial layer 132 is formed during an oxygen rich epitaxial process, second epitaxial layer 132 is preferably substantially free of oxygen. Like first epitaxial layer 132, second epitaxial layer 134 is preferably doped or undoped silicon or silicon germanium.

The process depicted in FIG. 6 through FIG. 9 includes two distinct epitaxial processes and additional processing between the two epitaxial steps. In another implementation, recessed source/drain structures 130 are formed with a single continuous epitaxial step. In this embodiment, protective oxide structures 126 are removed prior to the epitaxial step. If the single epitaxial step in this embodiment does not include an oxygen rich phase, electrical isolation between the recessed source/drain 130 and the underlying substrate 102 is achieved by appropriate doping of the two structures so that the resulting junction is reversed biased under normal operating conditions. This process may include implanting an impurity species into substrate 102 prior to performing the epitaxial growth.

Completion of recessed source/drain structures 130 results in the formation of a transistor 100 as depicted in FIG. 9. The depicted embodiment of transistor 100 includes a channel region 107 formed from a top layer of an SOI wafer and recessed, epitaxially formed (i.e., crystalline) source/drain structures 130 that extend through the SOI wafer buried oxide layer 104 to the underlying substrate 102 or to an oxide layer 136 overlying the substrate. Recessed source/drain structures 130 may include an oxygen rich portion and an oxygen free portion. Moreover, recessed source/drain structures 130 as shown in FIG. 9 feature sloped sidewalls 122 (FIG. 4) to reduce the junction capacitance with substrate 102. The recessed source/drain structures 130 have a thickness (vertical dimension) that is greater than the thickness of channel 107 thereby alleviating external resistance problems. Because, however, source/drain regions are recessed within BOX layer 104, an upper surface of source/drain structures 130 coincides approximately with an upper surface of channel 107. Thus, there is approximately no vertical overlap between source/drain structures 130 and transistor gate structure 110 the resulting overlap capacitance is negligible. While negligible overlap capacitance is generally desirable, there may be embodiments that do not substantially suffer from some degree of overlap. In some of these embodiments, the recessed source/drain structure described herein may be supplemented with an elevated source/drain structure if the resulting increase in parasitic capacitance is countered by an increase in overall device performance.

Referring now to FIGS. 10 through 13, an alternative processing sequence subsequent to that shown in FIG. 3 is presented. This second embodiment uses substantially vertically sidewalled and recessed source/drain regions and includes an alternative to the reoxidation step described above with respect to FIG. 5.

Figure 10:
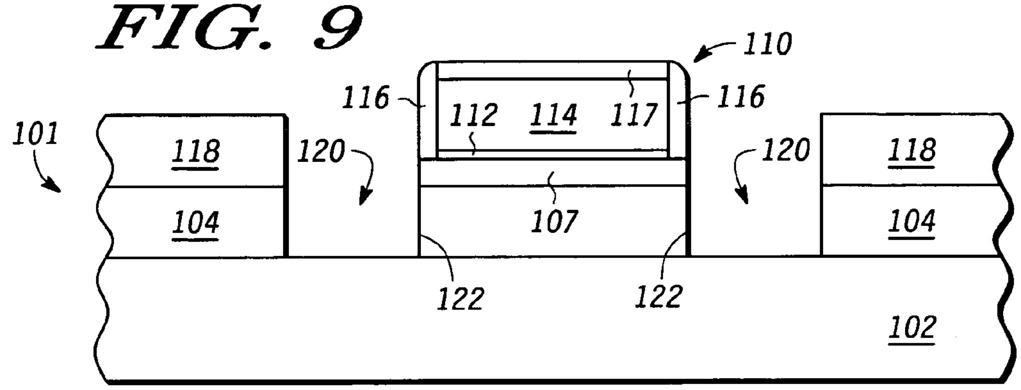
FIG. 10 illustrates alternative processing subsequent to FIG. 3 in which vertical sidewall source/drain trenches are formed in the buried oxide layer.

Referring to FIG. 10, source/drain trenches 120 are formed in BOX layer 104 using a patterned photoresist layer 118 and gate structure 110 as a mask. Source/drain trenches 120 as depicted in FIG. 10 have sidewalls that are substantially vertical or perpendicular to the upper surface of substrate 102. While the vertically sidewalled source/drain trenches 120 of FIG. 10 may result in higher junction capacitance between the source/drain regions and substrate 102 than the sloped sidewall source/drain structures of FIG. 9, the etch process to produce vertical sidewall trenches may be more repeatable or otherwise manufacturable than the sloped sidewall etch process. The junction capacitance of the vertically sidewalled, recessed source/drain structure that will be formed in trenches 120 is still reduced relative to the junction capacitance of bulk transistors, in which the source/drain regions are entirely enclosed by the surrounding substrate or well.

Figure 11:
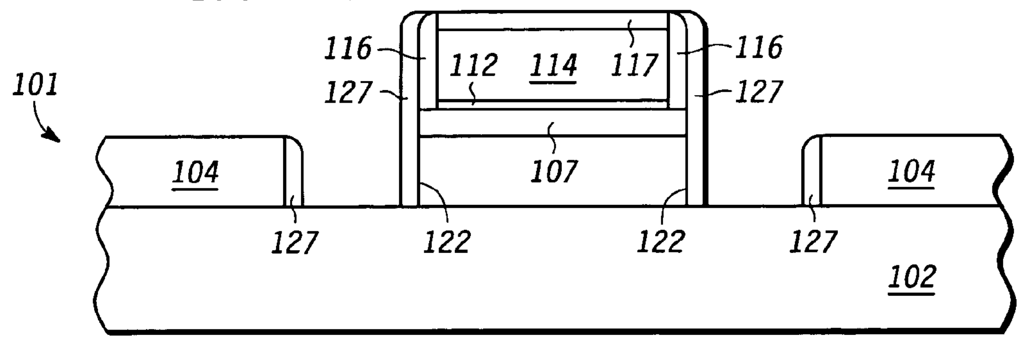
FIG. 11 illustrates alternative processing subsequent to FIG. 10 in which the active channel is protected by depositing an oxide spacer.

Referring to FIG. 11, an oxide spacer formation sequence is performed to form thin (preferably less than 8 nm) oxide spacer structures 127 on sidewalls of gate structure 110 and source/drain trenches 120 and thereby temporarily insulate channel structure 107 from subsequent processing steps. Spacer structures 127 are formed in a conventional spacer formation manner by depositing a dielectric such as a conformal oxide layer over wafer 101 and then etching the deposited layer with an anisotropic etch in a manner that will be familiar to those skilled in semiconductor processing. The spacer etch process clears the deposited oxide from the upper surface of substrate 102 in preparation for a subsequent epitaxial formation of the source/drain structures.

Figure 12:
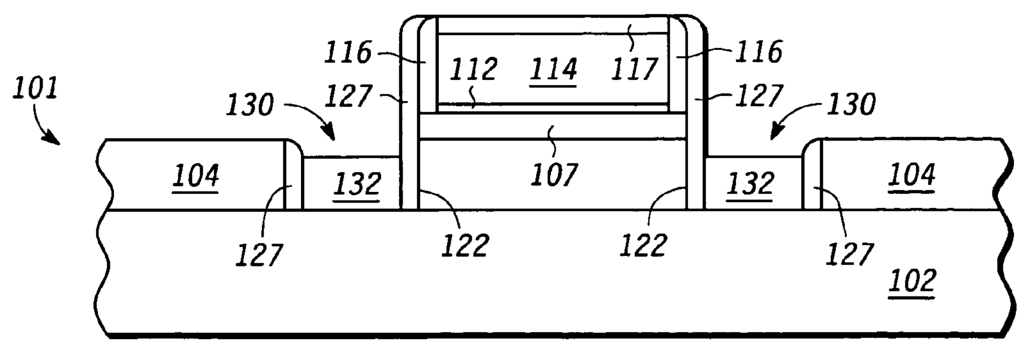
FIG. 12 illustrates alternative processing subsequent to FIG. 11 in which a first epitaxial structure is formed in the source/drain trenches.

Referring to FIG. 12, a first epitaxial layer 132 is formed by epitaxial growth or deposition overlying substrate 102. Like first epitaxial layer 132 of FIG. 6, first epitaxial layer 132 of FIG. 12 preferably fills only a portion of source/drain trench 120 and first epitaxial layer 132 is preferably an oxygen rich layer from which an isolation dielectric layer can be formed between the source/drain structure and the underlying substrate 102.

Figure 13:
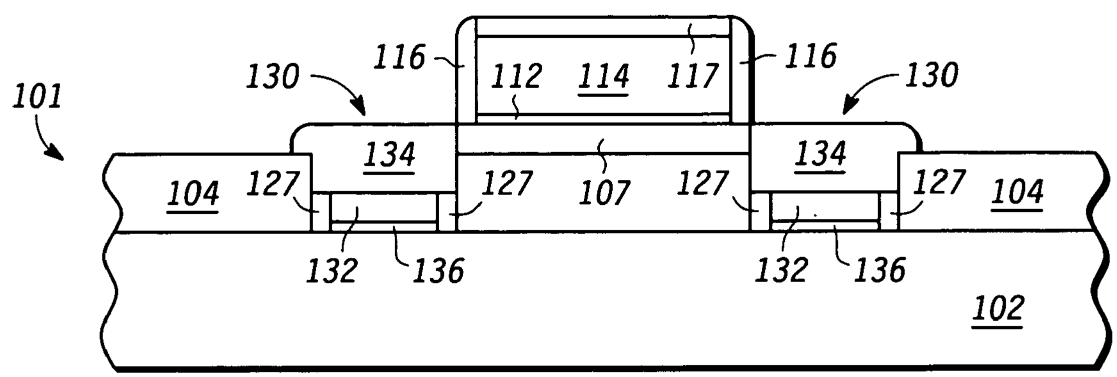
FIG. 13 illustrates alternative processing subsequent to FIG. 12 in which the protective oxide spacer is removed and a second epitaxial structure is formed to create the transistor source/drain regions.

Referring to FIG. 13, completion of the transistor is then achieved by first performing an anneal to form dielectric layer 136, removing the remaining and exposed portions of oxide spacers 127 (and any oxide layer overlying epitaxial layer 132 formed during the anneal step). The recessed source/drain structures 130 are then completed by a performing a second epitaxial process to grow a second epitaxial layer 134 overlying first epitaxial layer 132 and in contact with channel structure 107.

In the foregoing specification, the invention has been described with reference to specific embodiments. However, one of ordinary skill in the art appreciates that various modifications and changes can be made without departing from the scope of the present invention as set forth in the claims below. For example, the reoxidation process shown in conjunction with the sloped sidewall embodiment of source/drain structures 130 may be used in the vertically sidewalled embodiment. Conversely, the oxide spacer sequence shown in conjunction with the vertical sidewall embodiment of source/drain structures 130 may be used in the sloped sidewall embodiment. Also, the use of a single epitaxial step may be substituted for the sequence of performing an oxygen rich epitaxial step followed by an oxygen free epitaxial step. The single epitaxy embodiment may include a first phase in which an oxygen rich film is grown and a second phase in which an oxygen free film is grown. Alternatively, the single epitaxy step may omit the oxygen rich phase and, instead, isolate the source/drain structures from the substrates by appropriate doping. In addition, whereas specific material and compounds are referred to in the depicted implementations, alternative materials may be used when appropriate. Silicon nitride spacers 116 could, for example, be silicon oxynitride spacers.

Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process, comprising:

forming a transistor gate structure overlying a silicon-on-insulator (SOI) wafer, the SOI wafer including an active semiconductor top layer overlying a buried dielectric layer overlying a semiconductor substrate, the transistor gate structure including a gate electrode overlying a gate dielectric overlying a channel region comprised of a portion of the semiconductor top layer;

forming source/drain trenches in the buried dielectric layer disposed on either side of the gate structure, wherein the source/drain trenches extend through the buried dielectric layer exposing portions of the underlying semiconductor substrate; and forming source/drain structures within the source/drain trenches by epitaxial growth using the exposed portions of the semiconductor substrate as a seed, wherein an upper surface of the source/drain structure coincides approximately with an upper surface of the channel region;

where forming the source/drain structures includes forming a first portion of the source/drain structures as an oxygen-rich epitaxial film and forming a second portion of the source/drain structures as a substantially oxygen free epitaxial film.

2. The method of claim 1, further comprising, intermediate between forming the first portion of the source/drain structures and forming the second portion of the source/drain structures, performing a thermal anneal in an oxygen bearing ambient, wherein the thermal anneal results in formation of a dielectric layer disposed between the source/drain structures and the semiconductor substrate.

3. The method of claim 2, further comprising, performing an oxide removal to expose sidewalls of the channel region.

4. The method of claim 1, further comprising, prior to forming the first portion of the source/drain structures, forming spacers on sidewalls of the transistor gate structure and sidewalls of the source/drain trenches.

5. The method of claim 4, further comprising, between forming the first portion of the source/drain structures and the second portion of the source/drain structures, removing exposed portions the sidewall spacers to expose sidewalls of the channel region.

6. The method of claim 1, wherein forming the source/drain trenches includes forming source/drain trenches having substantially vertical sidewalls.

7. The method of claim 1, wherein forming the source/drain trenches includes forming source/drain trenches having sloped sidewalls, the sloped sidewalls forming an angle with an upper surface of the buried dielectric layer in the range of approximately 40 to 80.

8. The method of claim 1, wherein forming the source/drain structures includes forming source/drain structures comprised of a material selected from the group consisting of doped silicon, undoped silicon, doped silicon germanium, and undoped silicon germanium.

9. A semiconductor fabrication process for forming transistors in a silicon-on-insulator wafer having a semiconductor top layer overlying a buried oxide layer overlying a semiconductor substrate, the process comprising:

forming an active region and transistor gate structure overlying the wafer, the gate structure having a semiconductor portion overlying a gate dielectric;

forming source/drain trenches, self-aligned to the transistor gate structure, in the top silicon layer, the source/drain trenches including sloped sidewalls and extending through the buried oxide layer thereby exposing a portion of the underlying semiconductor substrate;

growing from the exposed portion of the semiconductor substrate, an oxygen rich portion of a source/drain structure in the source/drain trenches using a first epitaxial process; and growing a substantially oxygen free portion of the source/drain structure in the source/drain trenches using a second epitaxial process, wherein an upper surface of the source/drain structure coincides substantially with the first portion of the semiconductor substrate.

10. The method of claim 9, further comprising performing a thermal anneal between the first and second epitaxial processes to form an isolation dielectric at the interface between the source/drain structures and the underlying silicon substrate.

11. The method of claim 10, further comprising performing an oxide removal step between the thermal anneal and the second epitaxial process.

12. The method of claim 9, wherein the source/drain structures comprise a material selected from the group consisting of doped silicon, undoped silicon, doped silicon germanium, and undoped silicon german.

13. A semiconductor fabrication process, comprising:

forming a transistor gate structure overlying a silicon on insulator wafer, the wafer including a silicon top layer overlying a buried oxide layer overlying a silicon substrate;

etching source/drain trenches, disposed on either side of the transistor gate structure, into the buried oxide layer; and forming conductive source/drain structures within the trenches, wherein a depth of the source/drain structures is greater than the thickness of the top silicon layer and wherein an upper surface of the source/drain structures coincides with an upper surface of the silicon top layer underlying the transistor gate structure;

wherein forming the conductive source/drain structures comprises forming the source/drain structures epitaxially; and wherein forming the source/drain structures epitaxially includes performing a first epitaxial process using an oxygen rich ambient to produce an oxygen rich silicon epitaxial layer in a lower portion of the source/drain structures.

14. The method of claim 13, wherein forming the source/drain structures further includes thermally annealing the wafer to form an oxide between the lower portion of the source/drain structures and the underlying silicon followed by performing an oxide removal process to expose an upper surface of the silicon epitaxial layer and a portion of the silicon top layer underlying the transistor gate structure.

15. The method of claim 14, wherein forming the source/drain structures further includes performing a second epitaxial process using a substantially oxygen free ambient, wherein the second epitaxial layer connects with the portion of the silicon top layer underlying the transistor gate structure.

16. The method of claim 13, wherein etching the source/drain trenches is performed using the transistor gate structure as a mask wherein the trenches are self-aligned to the gate structure.

17. The method of claim 13, wherein the source/drain trenches extend through the buried oxide layer and expose a portion of the silicon substrate.

* * * * *